(12) United States Patent
Singh et al.

(10) Patent No.: US 7,221,060 B1
(45) Date of Patent: May 22, 2007

(54) COMPOSITE ALIGNMENT MARK SCHEME FOR MULTI-LAYERS IN LITHOGRAPHY

(75) Inventors: Bhanwar Singh, Morgan Hill, CA (US); Khoi A. Phan, San Jose, CA (US); Bharath Rangarajan, Sunnyvale, CA (US); Iraj Emami, Austin, TX (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 168 days.

(21) Appl. No.: 11/074,602

(22) Filed: Mar. 8, 2005

Related U.S. Application Data

(63) Continuation-in-part of application No. 10/653,309, filed on Sep. 2, 2003, now Pat. No. 7,001,830.

(51) Int. Cl.
*H01L 23/544* (2006.01)

(52) U.S. Cl. .................... 257/797; 438/462; 365/150

(58) Field of Classification Search .............. 257/797; 365/150, 399, 400, 401; 438/462, 599
See application file for complete search history.

(56) References Cited

U.S. PATENT DOCUMENTS 6,416,912 B1 * 7/2002 Kobayashi et al. .......... 430/22

* cited by examiner

*Primary Examiner*—Phuc T. Dang
(74) *Attorney, Agent, or Firm*—Amin, Turocy & Calvin, LLP

(57) ABSTRACT

Systems and/or methods are disclosed for aligning multiple layers of a multi-layer semiconductor device fabrication process and/or system utilizing a composite alignment mark. A component is provided to form the composite alignment mark, such that a first portion of the composite alignment mark is associated with a layer of the wafer and a second portion of the composite alignment mark is associated with a disparate layer of the wafer. An alignment component is utilized to align a reticle for a layer to be patterned to the composite alignment mark.

14 Claims, 10 Drawing Sheets

US 7,221,060 B1

COMPOSITE ALIGNMENT MARK SCHEME FOR MULTI-LAYERS IN LITHOGRAPHY

CROSS-REFERENCE TO RELATED APPLICATIONS

This application is a Continuation-in-Part of U.S. Ser. No. 10/653,309, filed on Sep. 2, 2003, (now U.S. Pat. No. 7,001,830) and entitled "SYSTEM AND METHOD OF PATTERN RECOGNITION AND METROLOGY STRUCTURE FOR AN X-INITIATIVE LAYOUT DESIGN," the entirety of which is incorporated herein by reference.

TECHNICAL FIELD

The present invention relates generally to semiconductor fabrication, and more particularly, the invention relates to systems and/or methodologies for aligning multiple layers of a multi-layer semiconductor device fabrication process and/or system during lithography utilizing alignment marks associated with disparate semiconductor layers.

BACKGROUND OF THE INVENTION

In the semiconductor industry, there is a continuing trend toward higher device densities. To achieve these high densities, there has been and continues to be efforts towards scaling down device dimensions (e.g., at submicron levels) on semiconductor wafers. In order to accomplish such high device packing densities, smaller and smaller feature sizes are required in integrated circuits (ICs) fabricated on small rectangular portions of the wafer, commonly known as dies. These smaller features can include width and spacing of interconnecting lines, spacing and diameter of contact holes, surface geometry such as corners and edges of various features as well as surface geometry of other features. To scale down device dimensions, more precise control of fabrication processes is required. The dimensions of and between features can be referred to as critical dimensions (CDs). Reducing CDs and reproducing more accurate CDs facilitates achieving higher device densities through scaled down device dimensions and increased packing densities.

Semiconductor integrated circuits undergo a variety of processing steps during manufacture, such as masking, resist coating, etching, deposition, etc. In many of these steps, material is overlayed or removed from the existing layer(s) at specific locations in order to form desired elements of the integrated circuit. Proper alignment of the various process layers is important, as the shrinking dimensions of modern integrated circuits require increasingly stringent overlay alignment accuracy. If proper alignment tolerances are not achieved, device defects can result.

Some types of alignment systems and/or methods employ large global alignment marks to align the wafer. For such systems and/or methods, a reticle includes a design pattern and an alignment mark. The alignment mark is typically located outside of the design pattern, although the alignment mark could be located within the design region, but at the expense of sacrificing design area real estate. The design pattern and alignment mark can be printed at several predetermined fields of a wafer. These printed alignment marks are found by a stepper system and are employed in wafer alignment, for example, for subsequent processing. The alignment marks typically resemble grating patterns with structures extending in orthogonal x and y directions, thus enabling alignment in the x and y directions between the wafer and the reticle with respect to adjacent layers. In some instances, alignment marks are printed within each exposure field to facilitate more precise alignment between the reticle and the wafer. For instance, the global alignment marks can be utilized to coarsely align exposure fields with the reticle, and the smaller alignment marks can be employed to more precisely align the exposure fields and the reticle.

Conventionally, alignment marks are created on a wafer substrate prior to placing one or more layers on the wafer. Thus, if a wafer comprises twenty layers of circuit components, a reticle associated with the twentieth layer will be aligned to the wafer with the same alignment marks utilized by a reticle associated with the second layer. According to another commonly employed technique, alignment marks are created with each layer formed upon the semiconductor wafer, and a subsequently formed layer is aligned to the alignment mark on the layer formed immediately prior. If errors in alignment are repeated over a plurality of layers, a wafer will be scrapped and throughput efficiency will be negatively affected.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to systems and methods that facilitate aligning a wafer and a reticle with respect to one another. The present invention can mitigate deficiencies associated with conventional techniques by providing techniques to align a layer to be added to a wafer and/or the reticle associated with the layer to disparate layers that were previously formed upon the wafer.

The subject invention provides for a composite alignment mark generation system that generates a composite alignment mark that facilitates concurrently aligning multiple layers of a multi-layer semiconductor device fabrication process and/or system. The composite alignment mark in accordance with the invention includes sets of sub-marks that are oriented in respective directions such that one set of sub-marks is associated with a first layer and another set of sub-marks is associated with another layer, and the respective sub-mark sets are employed to concurrently align multiple layers. It is to be appreciated that N number of mark sets can be utilized in connection with M number of layers—N and M being integers.

According to an aspect of the present invention, provided is a system that facilitates aligning of a wafer and a reticle. The system comprises a component that forms a composite alignment mark. The composite alignment mark comprises a first portion that is associated with a layer of the wafer and a second portion that is associated with a disparate layer of the wafer. Thus, by way of example, the first portion can be an x-component of the composite alignment mark, and it can be associated with a fifth layer formed upon the wafer. Additionally, the second portion can be a y-component of the composite alignment mark associated with a tenth layer created upon the wafer. The system further comprises an alignment component that can utilize the composite alignment mark to align the wafer and the reticle. Thus, with continued reference to the previous example, when forming the twentieth layer, the reticle associated with the twentieth layer can be aligned utilizing the composite alignment mark such that the twentieth layer is aligned to the fifth layer in the x-direction and the tenth layer in the y-direction.

According to an aspect of the present invention, a method for aligning a wafer and a reticle is provided. The method comprises creating a layer of a wafer and generating a first portion of a composite alignment mark associated with the created layer. The composite alignment mark can be patterned from a reticle associated with the created layer. The method further comprises creating an overlying layer and generating a second portion of the composite alignment mark associated with the overlying layer. The composite alignment mark can be utilized to align the wafer and the reticle. For example, the composite alignment mark can be aligned with an alignment mark of a reticle associated with a layer to be formed upon the wafer.

To the accomplishment of the foregoing and related ends, the invention then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed and the present invention is intended to include all such aspects and their equivalents. Other objects, advantages and novel features of the invention will become apparent from the following detailed description of the invention when considered in conjunction with the drawings.

DETAILED DESCRIPTION OF THE INVENTION

Figure 1:
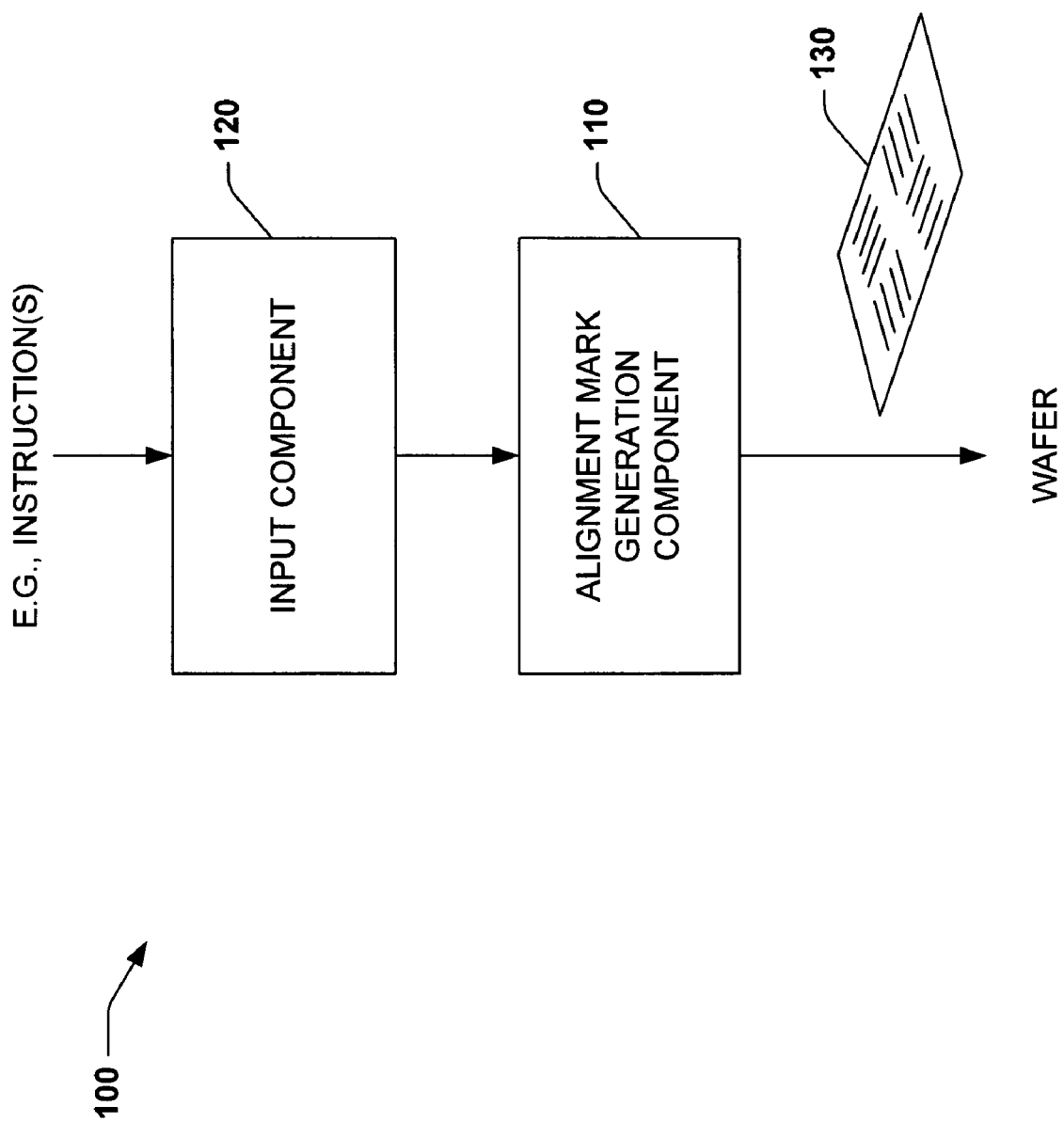
FIG. 1 is a block diagram of a composite alignment mark generation system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "component" is intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Turning now to FIG. 1, illustrated is a composite alignment mark generation system 100 in accordance with an aspect of the present invention. The system 100 comprises an alignment mark generation component 110 and an input component 120. The alignment mark generation component 110 generates a composite alignment mark 130. For example, the alignment mark generation component 110 can be utilized to transfer an alignment mark from a reticle onto a surface of a substrate such as a wafer (e.g., a wafer with a plurality of layers). The subject invention provides for a composite alignment mark generation system 100 that generates a composite alignment mark 130 that facilitates concurrently aligning multiple layers of a multi-layer semiconductor device fabrication process and/or system. The composite alignment mark 130 in accordance with the invention includes sets of sub-marks that are oriented in respective directions (e.g., x-direction, y-direction, sets are orthogonal to each other, . . . ) such that one set of sub-marks is associated with a first layer and another set of sub-marks is associated with another layer, and the respective sub-mark sets are employed to concurrently align multiple layers. It is to be appreciated that N number of mark sets can be utilized in connection with M number of layers—N and M being integers.

The alignment mark generation component 110 receives signal(s) (e.g., instruction(s)) via the input component 120. The input component 120 can provide instructions related to when to form the alignment mark, where to form the alignment mark, an orientation in which to form the alignment mark, etc. The input component 120 can transmit the instructions to the alignment mark generation component 110 automatically (e.g., in response to a reticle being aligned to a previously created alignment mark), upon a user provided signal (e.g., via mouse, keyboard, joystick, . . . ), etc. It is to be appreciated that the alignment mark generation component 110 and/or the input component 120 can comprise or be associated with a component that determines a plurality of layers to be formed on a wafer.

The alignment mark generation component 110 facilitates formation of the composite alignment mark 130 on the wafer. The alignment mark generation component 110 can transfer a pattern corresponding to an alignment mark of a reticle onto the wafer. By way of example, the alignment mark generation component 110 can form a composite alignment mark 130 with sets of sub-marks that include a set in the x-direction (e.g., x-component, x-portion) and/or a set in the y-direction (e.g., y-component, y-portion). The x-component and the y-component can be formed based upon patterns (e.g., reticle alignment marks) from disparate reticles employed to pattern disparate layers of a semiconductor device, and thus, utilized at different times. Thus, for example, a composite alignment mark 130 can be created where the x-component is formed around a time that a tenth layer is laid down utilizing a reticle associated with the tenth layer, while the y-component is laid down around a time the thirtieth layer is created employing a reticle associated with the thirtieth layer. It is to be appreciated that any combination of layers can be utilized to create the composite alignment mark 130. For example, the y-component can be formed prior to the x-component (e.g., y-component from third layer, x-component from eighth layer). Additionally, any number of composite alignment marks 130 can be formed. Moreover, if a plurality of composite alignment marks are formed, each can comprise the same (e.g., x-component from first layer, y-component from second layer for both), similar (e.g., one mark comprises x-component from first layer, y-component from second layer; second mark comprises x-component from second layer, y-component from first layer) and/or disparate (e.g., one mark comprises x-component from first layer, y-component from second layer; second mark comprises x-component from third layer, y-component from forth layer) combinations of x and y-components. According to an aspect of the present invention, the present invention is not limited to a composite alignment mark comprising two components (e.g., x-component and y-component). For example, the composite alignment mark can comprise three or more components (e.g., N number of mark sets, portion, x-component, y-component, z-component, . . . ) oriented in respective directions.

Figure 2:
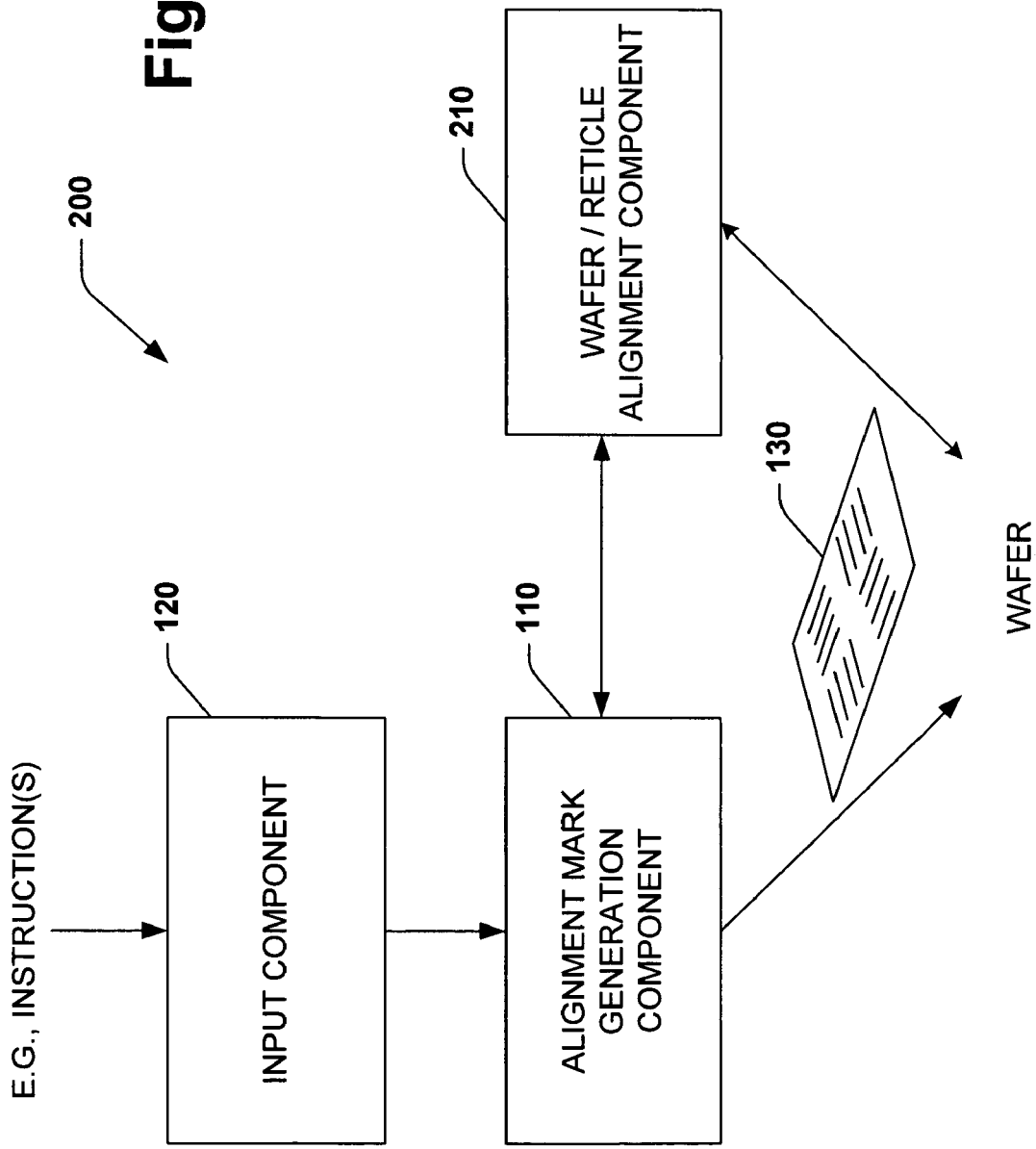
FIG. 2 is a block diagram of a wafer layer alignment system in accordance with an aspect of the present invention.

With reference to FIG. 2, illustrated is a system 200 for aligning layers of a wafer in accordance with an aspect of the present invention. The system 200 comprises the alignment mark generation component 110 that receives instructions from the input component 120 and forms the composite alignment mark 130 upon a wafer as described supra. The alignment mark generation component 110 is further coupled to a wafer/reticle alignment component 210, which aligns a wafer and a reticle in a desired positional relationship.

The wafer/reticle alignment component 210 inspects the wafer, and in particular, a composite alignment mark(s) 130 built upon the wafer via the alignment mark generation component 110. For example, the wafer/reticle alignment component 210 can transmit low-energy laser beams through an alignment mark of a reticle and onto the composite alignment mark 130, and receive a reflected beam. The received signal can be analyzed for proper alignment and utilized to change the position of a reticle and/or wafer. Alternatively and/or additionally, the wafer/reticle alignment component 210 can employ a vision system that employs a camera, which captures a picture of the reticle and/or the wafer (possibly including the composite alignment mark). The picture can be compared to pictures stored in a data base, and utilized to reposition the reticle and wafer with respect to one another. Additionally, the wafer/reticle alignment component 210 can move the wafer and/or reticle to facilitate a proper alignment between them. According to an aspect of the present invention, once a reticle is in a proper position, the wafer/reticle alignment component 210 can send a signal to the alignment mark generation component 110, which can employ the properly positioned reticle to form a component (e.g., x-component, y-component) for one or more composite alignment marks upon a wafer.

Figure 3:
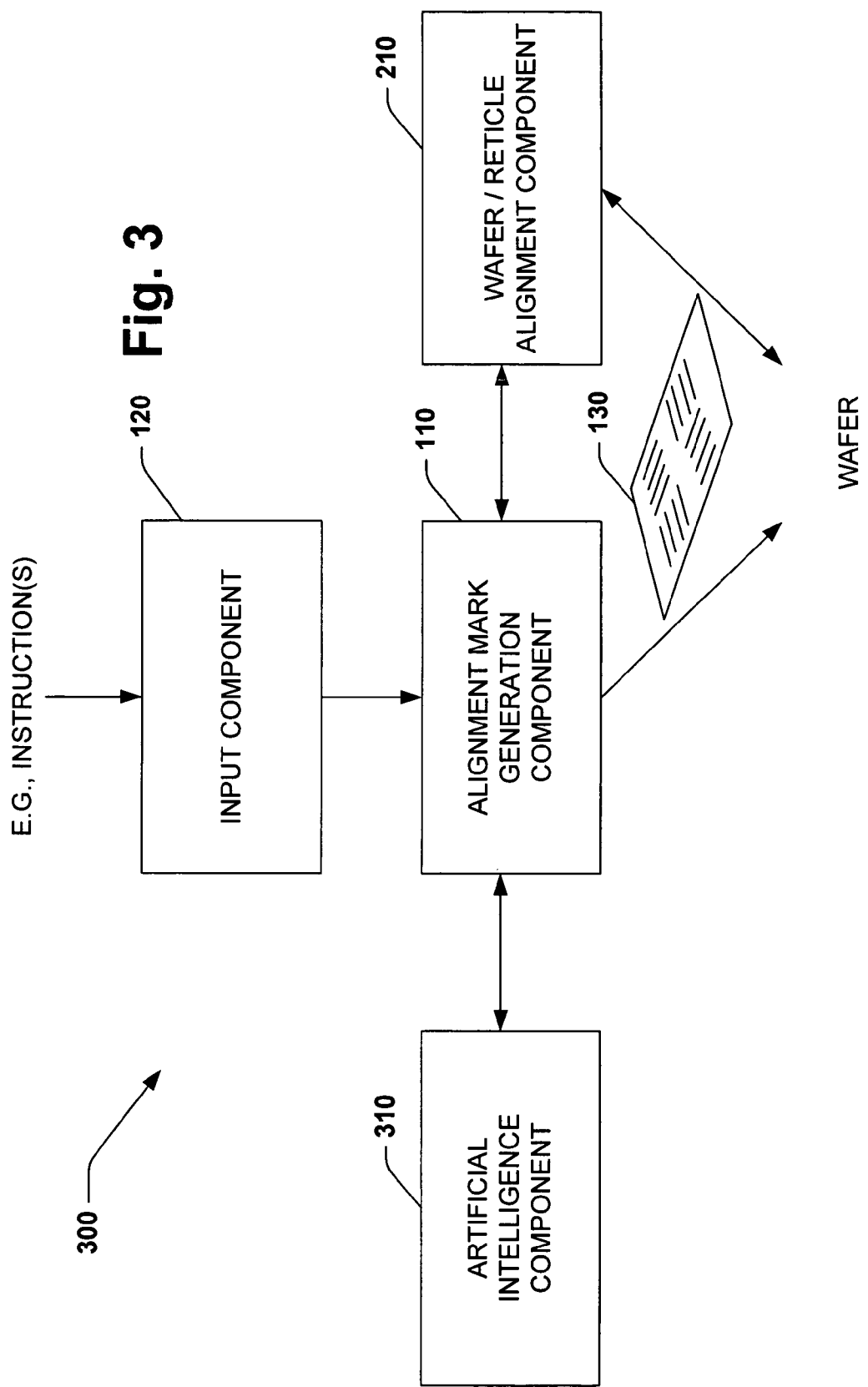
FIG. 3 is a block diagram of a wafer layer alignment system that employs intelligence in accordance with an aspect of the present invention.

Turning to FIG. 3, it is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function line networks) can be employed. The invention can employ various inference schemes and/or techniques in connection with state determination, inference and/or prediction. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, illustrated is a system 300 that facilitates alignment between a wafer and a reticle in accordance with an aspect of the present invention. The system 300 comprises the alignment mark generation component 110 that forms composite alignment marks 130 upon a wafer. The composite alignment marks can include components (e.g., sub-marks, portions, x-component, y-component, oriented in respective directions, . . . ) built utilizing disparate reticles associated with patterning of disparate layers of a semiconductor device. Thus, for example, the x-component can be constructed employing a reticle for a first layer around the time that the first layer is formed, while a y-component can be created with a reticle for a second layer around the time that the second layer is formed.

The alignment mark generation component 110 receives a signal from the input component 120. As described above, the signal can be an instruction(s) related to formation of a component of the composite alignment mark 130 upon a wafer. The alignment mark generation component 110 is also coupled to the wafer/reticle alignment component 210 that positions the wafer and reticle in a desired position with respect to one another.

The alignment mark generation component 110 is further coupled to an artificial intelligence component 310. The artificial intelligence component 310 can perform inferences associated with formation of the components (e.g., x-component, y-component) of the composite alignment mark. For example, the artificial intelligence component 310 can infer which layers (and corresponding reticles) to utilize for forming the composite alignment mark. Additionally, the artificial intelligence component 310 can infer how many composite alignment marks to create, which can then be utilized by the wafer/reticle alignment component 210 for formation of overlaying layers.

By way of example, the present invention contemplates the use of multiple composite alignment marks 130; thus, the wafer and reticle can be aligned utilizing any number of these composite alignment marks 130. Additionally, techniques such as averaging can be utilized to determine a desired alignment. The present invention further contemplates that the artificial intelligence component 310 can interact with the wafer/reticle alignment component 210 (such interaction not shown in FIG. 3) to infer a positional relationship between the wafer and reticle (and/or a stepper).

Figure 4:
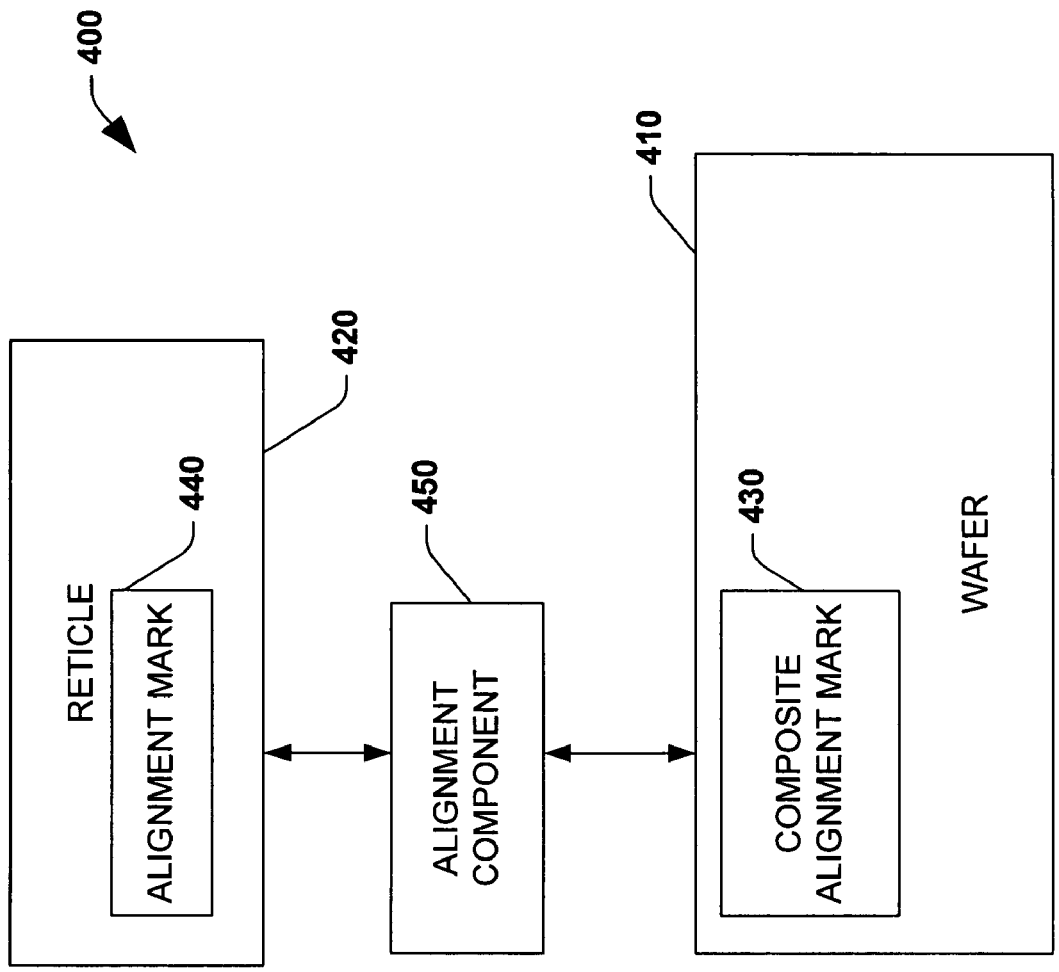
FIG. 4 is a block diagram of a system that facilitates wafer alignment in accordance with an aspect of the present invention.

Turning now to FIG. 4, a system 400 that facilitates alignment of a wafer 410 and a reticle 420 is illustrated. The system 400 enables alignment of a desirably placed layer with respect to two or more previously aligned layers, thus mitigating deficiencies relating to overlay of multiple layers associated with conventional systems. The system 400 comprises a wafer 410 upon which a plurality of layers can be built, wherein the wafer 410 is associated with a composite alignment mark 430 associated with two or more layers of the wafer 410. For example, at a substantially similar time that a layer is added to the wafer 410, an alignment mark (e.g., one or more gratings) that facilitates alignment in a first dimension (e.g., an x dimension) can be placed on the wafer 410. At a substantially similar time that a subsequent layer is added to the wafer 410, a second alignment mark that facilitates alignment in a second dimension (e.g., a y dimension) can be placed on the wafer 410. The two alignment marks can be proximately positioned, thereby generating the composite alignment mark 430 that represents disparate dimensions (e.g., x and y) for disparate layers of the wafer 410.

The composite alignment mark 430 is utilized to align the reticle 420 with respect to layers represented by the composite alignment mark 430. The reticle 420 comprises an alignment mark 440 that can be aligned to the composite alignment mark 430 via an alignment component 450. The alignment mark 440 is substantially similar to the composite alignment mark 430, thereby facilitating effective alignment of the reticle 420 with respect to disparate layers of the wafer 410. For instance, the composite alignment mark 430 can include gratings representing a first layer of the wafer 410 in an x dimension, and further include gratings representing a second layer of the wafer 410 in a y dimension. Thus, when the alignment mark 440 is aligned to the composite alignment mark 430 via the alignment component 450, the reticle 420 will be properly aligned with the first layer with respect to the x dimension, and further properly aligned with the second layer with respect to the y dimension.

The alignment component 450 facilitates properly aligning the composite alignment mark 430 with the alignment mark 440. The alignment component 450 can be, for example, an optical microscope that operates in connection with an image analyzer. Alternatively, scanning electron microscopy and/or a camera can be employed in connection with effectively aligning the composite alignment mark 430 with the alignment mark 440. Moreover, the alignment component 450 can comprise a control component (not shown) that positions a wafer stage (not shown) and/or a wafer holder (not shown) to ensure proper alignment between the composite alignment mark 430 and the alignment mark 440.

In accordance with one aspect of the present invention, the composite alignment mark 430 enables alignment of the reticle 420 to non-adjacent layers of the wafer 410. For example, a first dimension (e.g., x dimension) of the composite alignment mark 430 can be created with respect to a first layer of the wafer 410, and a second dimension (e.g., y dimension) of the composite alignment mark 430 can be created with respect to a fifth layer of the wafer 410. Thereafter, the reticle 420 can be employed to generate a tenth layer of the wafer 410; thus, the reticle 420 associated with the tenth layer can be aligned in the x dimension with respect to the first layer and aligned in the y dimension with respect to the fifth layer. Therefore, it is to be understood that the present invention facilitates alignment of a layer with respect to two disparate previously constructed layers. Additionally, the present invention contemplates any combination of previously established layers can be utilized to create the composite alignment mark 430.

By way of illustration, during fabrication of an IC, a wafer lithography system can employ a reticle 420 to project a pattern of light onto a photoresist layer deposited upon a wafer 410. The projected light changes properties of exposed portions of the photoresist layer such that a subsequent development process forms a mask from the photoresist layer, which exposes or protects different portions of the wafer 410. The masked wafer 410 is then removed to a reaction chamber where a process such as etching changes the exposed portions of the wafer 410. Typically, a wafer lithography system forms several masks on the wafer 410 during an IC fabrication process, and the masks must be aligned with each other to form a working IC.

The alignment component 450 can comprise a wafer stepper (not shown), which typically is utilized to align the wafer 410 during the various process steps. The wafer stepper employs one of a number of commercially available techniques to generate alignment signals that indicate position relative to the wafer 410. The alignment signals can be produced by optical measurement of the composite alignment mark(s) 430 placed at specified locations on the wafer 410. The reticle 420 is utilized to place the appropriate marks (e.g., x-component, y-component, . . . ) on a particular wafer process layer such that the marks can be readily identifiable by the wafer stepper in subsequent processing steps. The reticle 420 includes a pattern that can be etched into the wafer using optical photolithography. Common alignment mark techniques include Laser Step Alignment (LSA), Laser Interferometric Alignment (LIA), Global Alignment Mark (GAM), and Global Alignment Mark Laser Step Alignment (GAMLSA). In a step-and-repeat type apparatus, the wafer 410 can be aligned and moved in steps that are of predetermined distances. For example, the wafer 410 typically is placed on a two-dimensionally moveable stage and positioned relative to a projected image of a reduction projection type exposure apparatus.

Figure 5:
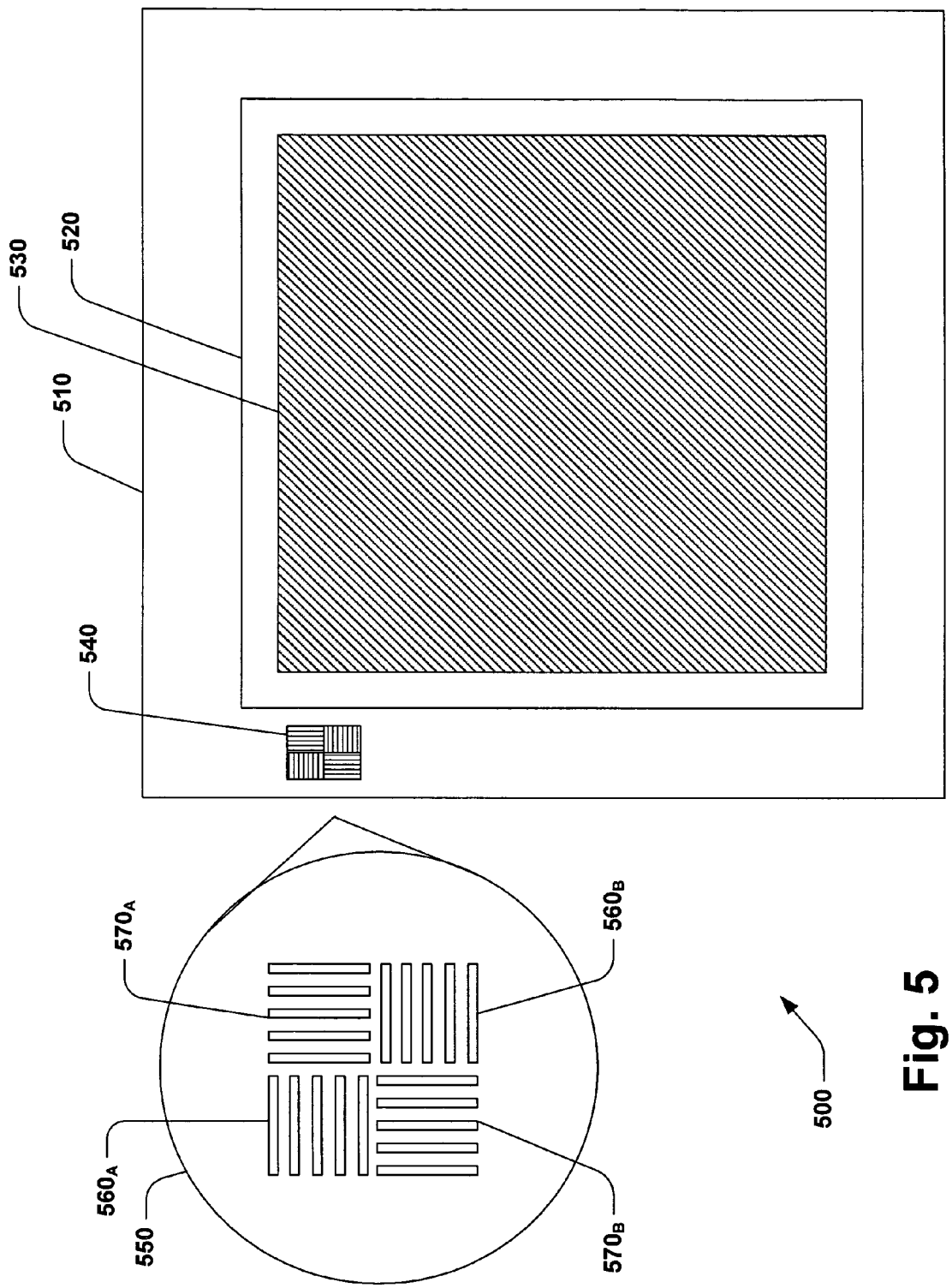
FIG. 5 is an illustration of a composite alignment mark system in accordance with an aspect of the present invention.

Turning now to FIG. 5, illustrated is a system 500 utilized to facilitate aligning a reticle with respect to a wafer 510. For example, the wafer 510 can be comprised of silicon and can have a plurality of layers. A first layer 520 is overlaid upon the wafer 510, and a second layer 530 is overlaid upon the first layer 520. Additionally, a composite alignment mark 540 is formed upon the wafer 510.

The composite alignment mark 540 can be employed to align a reticle (not shown) and the wafer 510 to a proper position with respect to each other; thus, an additional layer (not shown) can be built upon the second layer 530 with the proper alignment by aligning an alignment mark on the reticle associated with the additional layer to the composite alignment mark 540. An exploded view of the composite alignment mark 540 is illustrated at 550. The composite alignment mark 540 comprises gratings for aligning a reticle in an x direction and in a y direction. By way of example, the x-component $560_A$ and $560_B$ (hereinafter referred to as reference numeral 560) of the composite alignment mark 540 can be formed at a substantially similar time compared to when the first layer 520 is formed. Additionally, the y-component $570_A$ and $570_B$ (hereinafter referred to as reference numeral 570) of the composite alignment mark 540 can be formed at a substantially similar time compared to when the second layer 530 is formed. Thus, when an additional layer is to be overlaid upon the second layer 530, it can be aligned in the x direction to the first layer 520 via the x-component 560 of the composite alignment mark 540, and aligned in the y direction to the second layer 530 via the y-component 570 of the composite alignment mark 540.

It is to be appreciated that a silicon wafer process can include the fabrication of twenty or more layers upon a single wafer. A component (e.g., portion, x-component 560, y-component 570, . . . ) of the composite alignment mark 540 can be laid down according to the fabrication of any layer. Thus, additional layers added upon a semiconductor device (e.g., wafer 510) can be aligned achieving optimum overlay in both the x and y directions for its particular circuit requirements by aligning the x dimension to the x-component 560 and the y dimension to the y-component 570 of the composite alignment mark 540. While the composite alignment mark 540 is depicted as two sets of gratings in the x direction (x-component 560) and two sets of gratings in the y direction (y-component 570), the present invention contemplates that any suitable arrangement of markings can be utilized in connection with the present invention.

Figure 6:
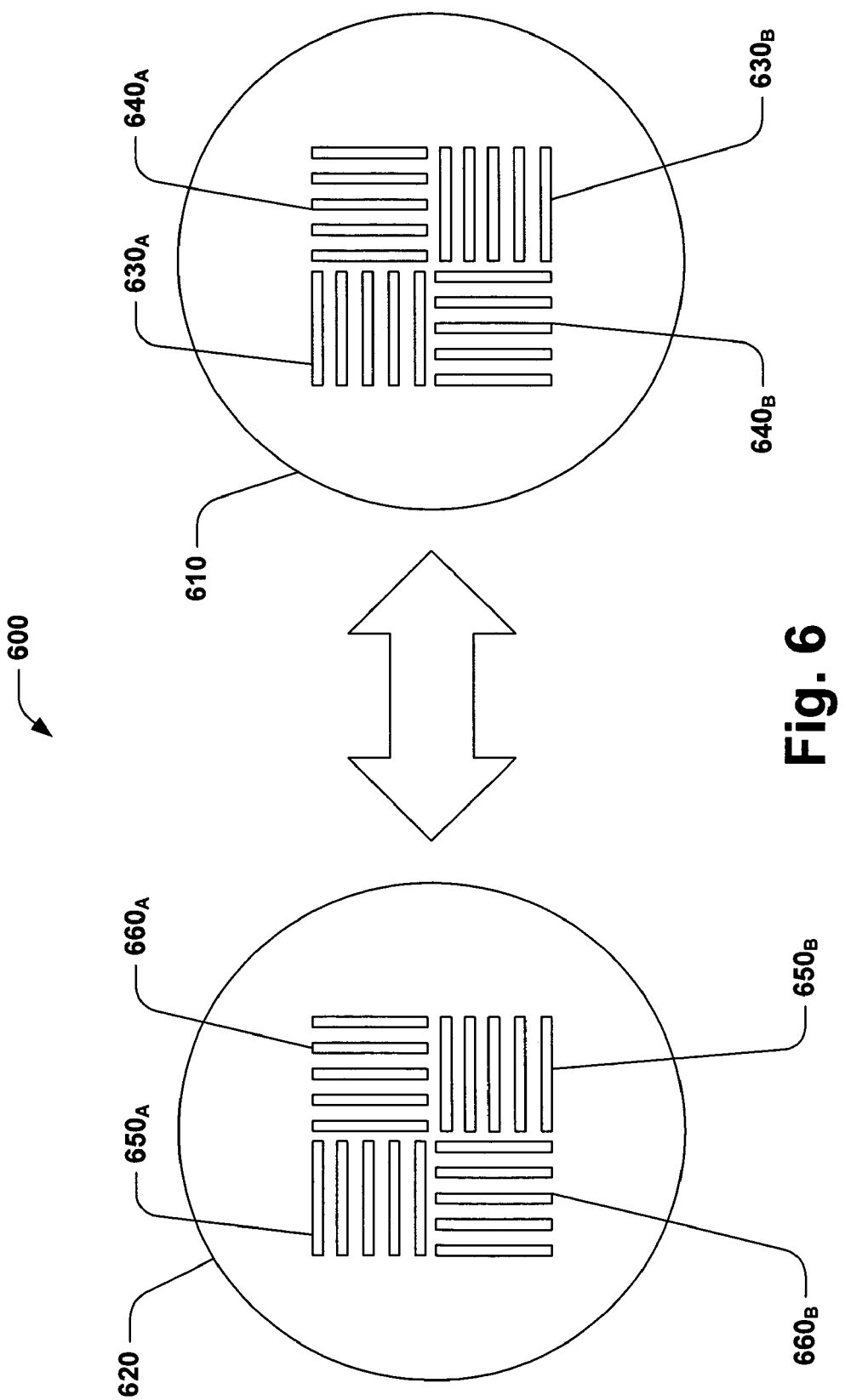
FIG. 6 is an illustration of an alignment mark of a reticle and a composite alignment mark of a wafer in accordance with an aspect of the present invention.

Turning to FIG. 6, illustrated is an exemplary system 600 for aligning a reticle and a wafer in accordance with an aspect of the present invention. The system 600 comprises an alignment mark 610 of a reticle (e.g., reticle 440) and a composite alignment mark 620 of a wafer (e.g., wafer 410). The alignment mark 610, for example as depicted in FIG. 6, can include two sets of gratings in the x direction $630_A$, $630_B$ (hereinafter referred to as reference numeral 630) and two sets of gratings in the y direction $640_A$, $640_B$ (hereinafter referred to as reference numeral 640); however, the present invention is not limited to such a configuration for the alignment mark 610. The alignment mark 610 is formed upon the reticle.

The composite alignment mark 620, as illustrated in FIG. 6, comprises two sets of gratings in the x direction $650_A$, $650_B$ (hereinafter referred to as 650) and two sets of gratings in the y direction $660_A$, $660_B$ (hereinafter referred to as 660). By way of example, the x direction gratings 650 can be formed utilizing a reticle associated with patterning a tenth layer of the semiconductor device at a time of forming the tenth layer, and the y direction gratings 660 can be formed utilizing a reticle associated with patterning a thirtieth layer at a time of constructing the thirtieth layer. The gratings 650, 660 can be formed by patterning a portion (e.g., x-component, y-component, . . . ) of the alignment marks associated with each of the particular layers (e.g., tenth layer, thirtieth).

With regards to aligning an additional layer to be patterned upon the wafer (to which alignment mark 610 corresponds), the reticle and the wafer can be aligned with respect to one another by aligning the components 630, 640 of the alignment mark 610 to the respective components 650, 660 of the composite alignment mark 620. Thus, the markings of the alignment mark 610 correspond to the markings of the composite alignment mark 620. Any suitable alignment technique can be employed in connection with the present invention (e.g., SEM, camera, laser, . . . ). This alignment scheme can apply to all stepper manufacturers (e.g., ASML marks).

Figure 7:
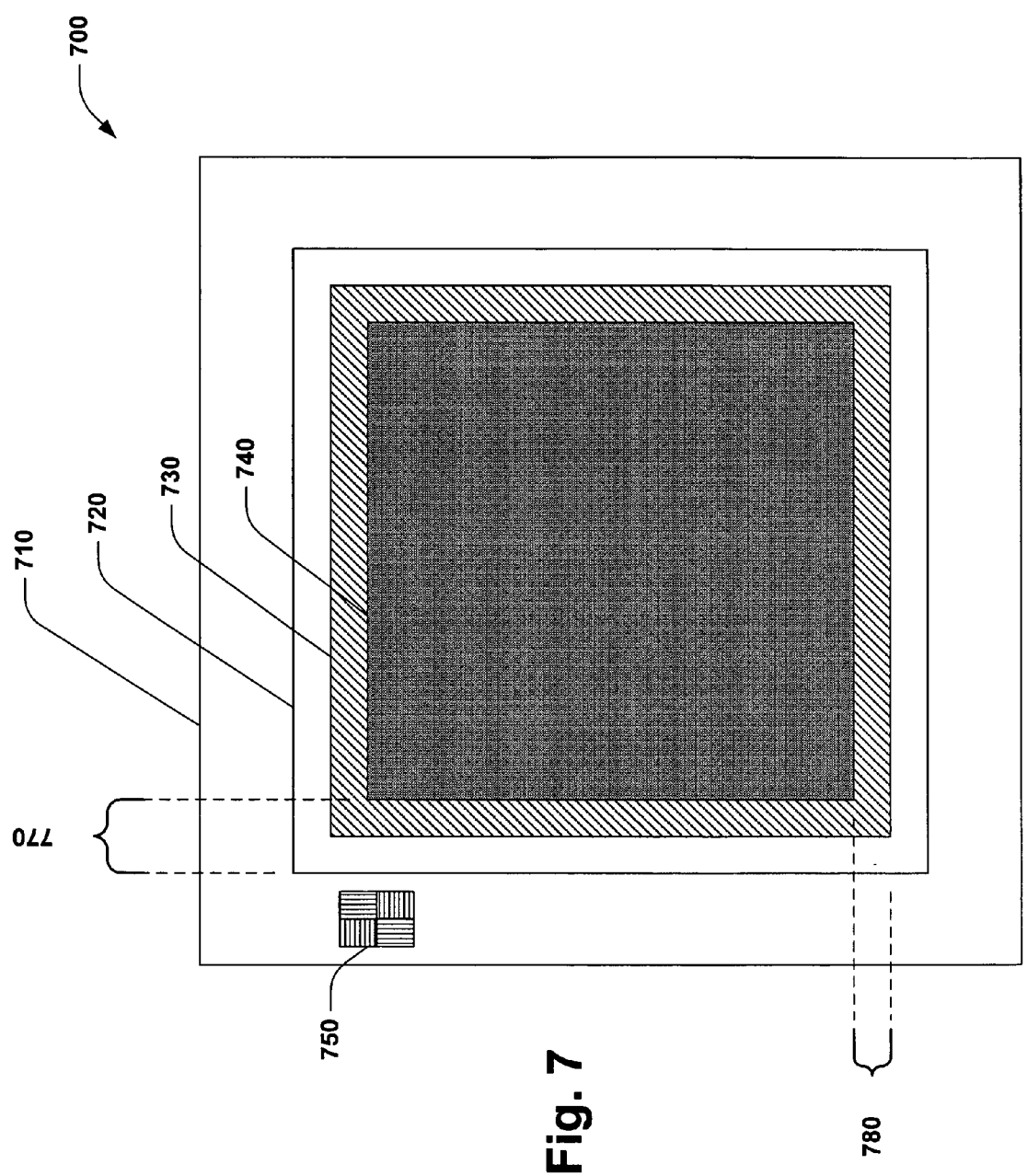
FIG. 7 is an illustration of an exemplary composite alignment system in accordance with an aspect of the present invention.

Turning to FIG. 7, illustrated is an exemplary composite alignment system 700 in accordance with an aspect of the present invention. The system 700 comprises a wafer 710, a first layer 720 overlaid upon the wafer 710, a second layer 730 overlaid upon the first layer 720, a third layer 740 overlaid upon the second layer 730, and a composite alignment mark 750. By way of illustration, the composite alignment mark 750 can be utilized to align the third layer 740. For example, the composite alignment mark 750 can comprise gratings formed in an x direction associated with the second layer 730 and gratings formed in a y direction associated with the first layer 720. Thus, the third layer 740 is positioned by aligning it to the first layer 720 in the direction illustrated by 770 and aligning the third layer 740 to the second layer 730 in the direction illustrated by 780.

Figure 8:
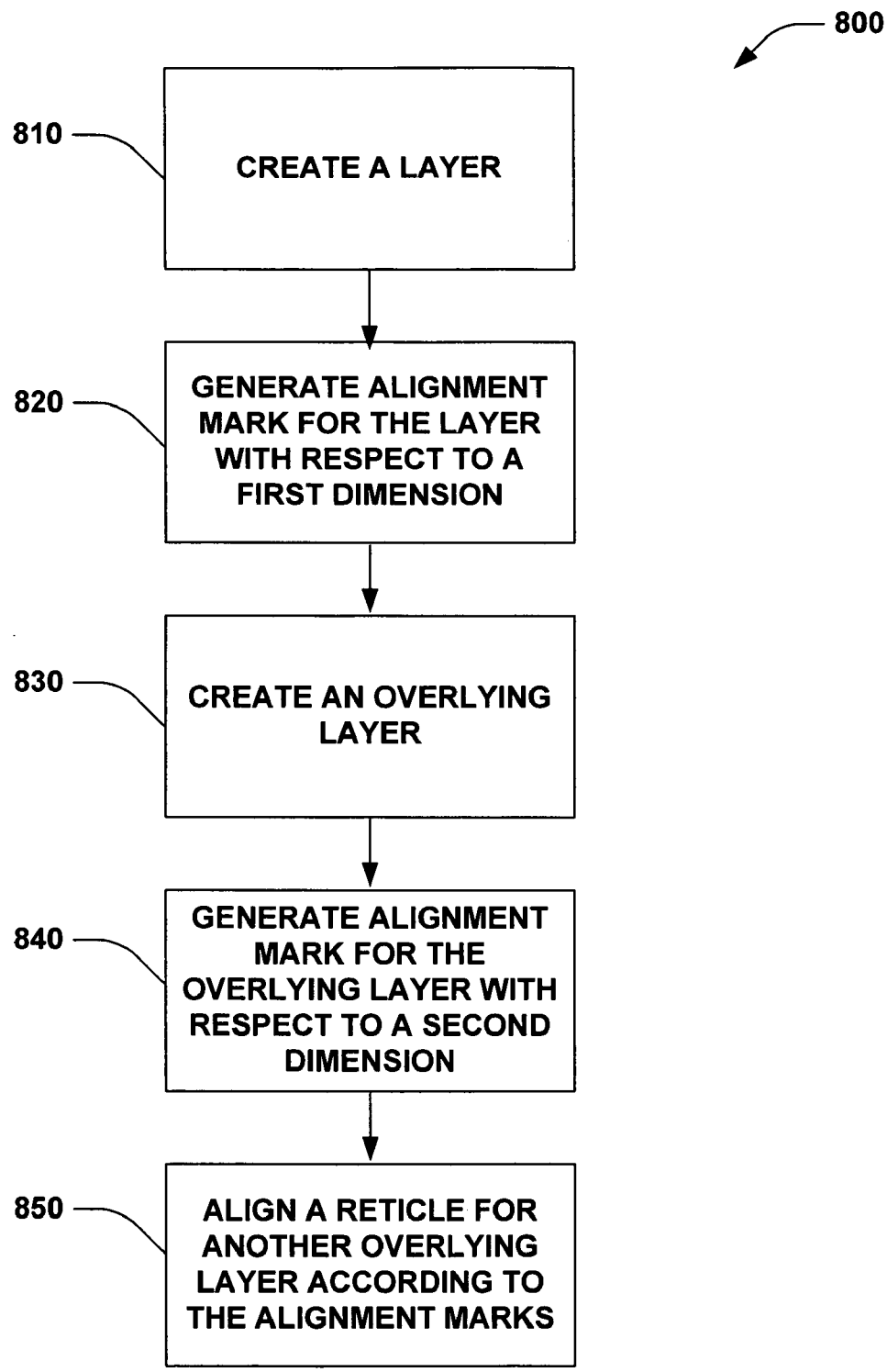
FIG. 8 is a representative flow diagram illustrating alignment of a layer utilizing a composite alignment mark in accordance with an aspect of the present invention.

In view of the exemplary systems shown and described above, methodology 800, which may be implemented in accordance with the present invention, will be better appreciated with reference to the flow diagrams of FIG. 8. While, for purposes of simplicity of explanation, the methodology 800 is shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodology 800 in accordance with the present invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

With reference to FIG. 8, illustrated is a methodology 800 for aligning a layer that is formed upon a wafer according to an aspect of the present invention. At 810, a layer is created, for example, by employing a first reticle. An alignment mark for the layer is generated with respect to a first dimension (e.g., x direction, y direction) at 820. For example, a fifth layer can be formed, and a corresponding x-component of the alignment mark of the reticle can be utilized to form the x-component of the composite alignment mark. At 830, an overlying layer is created. At 840, an alignment mark corresponding to the overlying layer is generated for a second dimension. Thus, by way of example, a tenth layer can be formed, and the y-component of the alignment mark of the reticle for the tenth layer can be employed to generate the y-component of the composite alignment mark. At 850, a reticle associated with another overlying layer (e.g., eleventh layer, twelfth . . . ) to be formed subsequent to the layer formed at 830 is aligned to the composite alignment mark (e.g., the mark in the x direction corresponding to the fifth layer and the mark in the y direction corresponding to the tenth layer). The present invention contemplates aligning the reticle to the composite alignment mark by any means.

Figure 9:
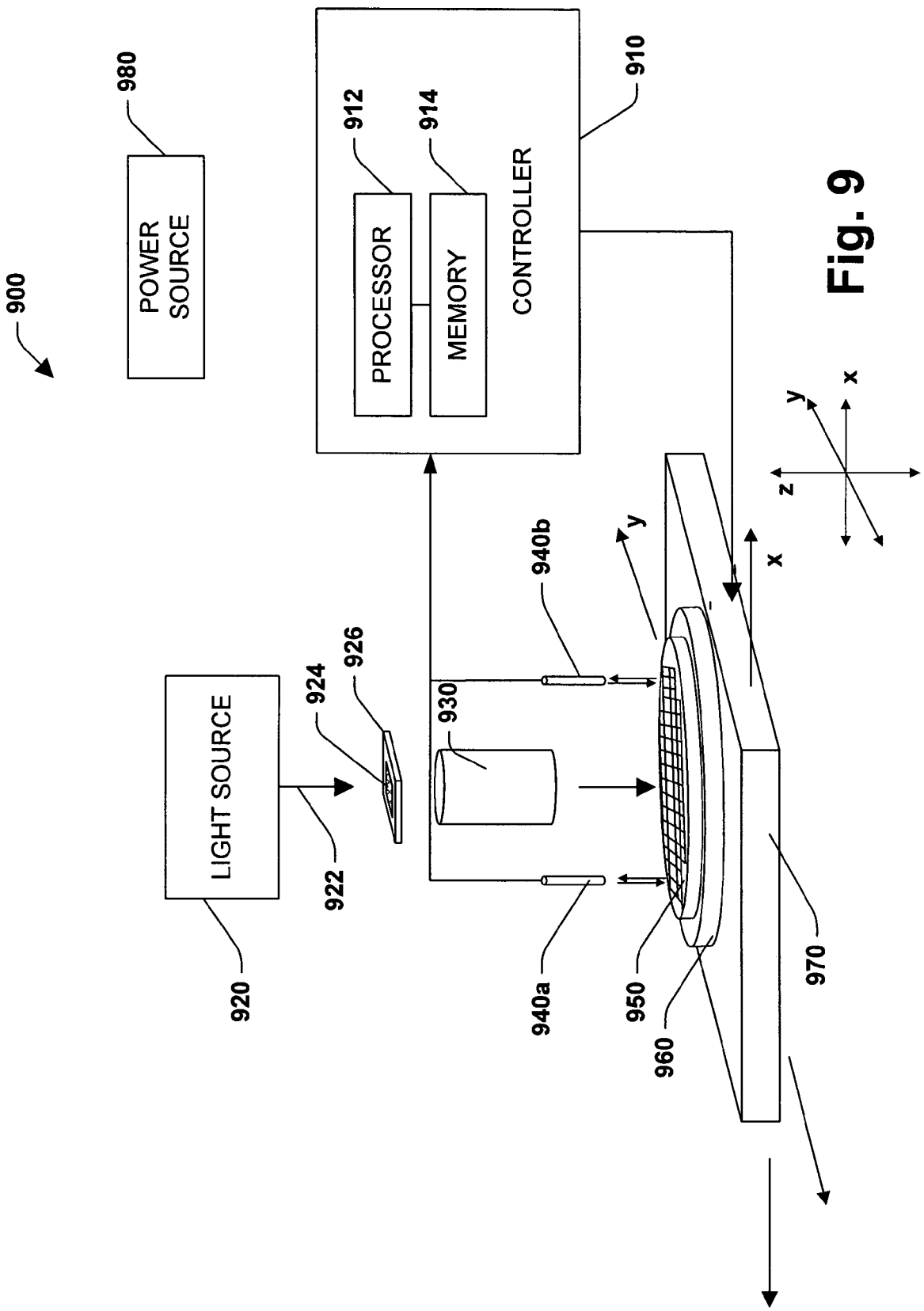
FIG. 9 is an exemplary alignment system utilizing a composite alignment mark in accordance with an aspect of the present invention.

FIG. 9 is a representative system 900 for wafer alignment in accordance with the present invention. The system 900 includes a reticle 926 with a design pattern 924 (including an alignment mark). A light source 920 projects light 922 through the reticle 926 so as to project the design pattern 924 onto a wafer 950. The light 922 from the light source 920 passes through the reticle 926 and through the optical axis of a projection lens system 930. The projection lens system 930 projects the design pattern 924 of the reticle 926 onto the wafer 950 while in most cases substantially reducing the imaged design pattern. It is to be appreciated that reflection-type systems, scanning systems and other suitable systems may be employed in carrying out the present invention.

A wafer holder 960 vacuum-adsorbs the wafer 950 and is provided for slight rotation relative to a stage 970 two-dimensionally moveable in an x-direction and y-direction. The stage 970 and wafer holder 960 are controlled by a controller 910. The controller 910 effects rotation of the wafer holder 960 and movement of the stage 970 (via a plurality of motors (not shown)) for wafer alignment and positioning. The controller 910 includes a processor 912, which is programmed to control and operate the various components within the system 900 in order to carry out the various functions described herein. The manner in which the processor 912 can be programmed to carry out the functions relating to the present invention will be readily apparent to those having ordinary skill in the art based on the description provided herein.

A memory 914 that is operatively coupled to the processor 912 is also included in the controller 910 and serves to store program code executed by the processor 912 for carrying out operating functions of the system 900 as described herein. The memory 914 includes, for example, read only memory (ROM) and random access memory (RAM). The RAM is the main memory into which the operating system and application programs are loaded. The memory 914 also serves as a storage medium for temporarily storing information such as reticle position, wafer position, reticle coordinate tables, wafer coordinate tables, alignment mark information, composite alignment mark information, printed alignment mark information, virtual alignment mark information, programs for determining virtual alignment mark locations and other data which may be employed in carrying out the present invention. For mass data storage, the memory 914 may also include a hard disk drive (e.g., 50 Gigabyte hard drive).

A power source 980 provides operating power to the system 900. Any suitable power source (e.g., battery, line power) may be employed to implement the present invention.

In one specific case, the system 900 further includes off-axis type wafer alignment microscopes 940a and 940b (collectively referred to by reference number 940). The microscopes 940 have optic axes parallel to the optic axis of the projection system 930 and image on the wafer 950 band-like laser light spots (not shown), for example. The band-like laser spots are light of a wavelength that does not activate the photosensitive agent (photoresist) on the wafer 950. Each microscope 940 has a photo-element (not shown) receiving scattered light and diffracted light from the alignment marks printed on the wafer surface (photoresist). The microscopes 940 also include systems for synchronizing and rectifying the photoeletric signal output by the photo-elements, respectively, at the vibration period of the light spot(s) and output an alignment signal corresponding to alignment mark deviation relative to the center of vibration of the light spot(s). It is to be appreciated that the wafer alignment mark positioning systems are evolving rapidly and any suitable positioning system (e.g., through the lens system) may be employed to carry out the present invention and is intended to fall within the scope of the hereto-appended claims.

Wafer alignment systems are well known in the art, and therefore it is to be appreciated that conventional aspects of the system 900 are described herein at a high level or omitted for sake of brevity. One skilled in the art could readily construct a wafer alignment system in accordance with the present invention based on the teachings herein.

Figure 10:
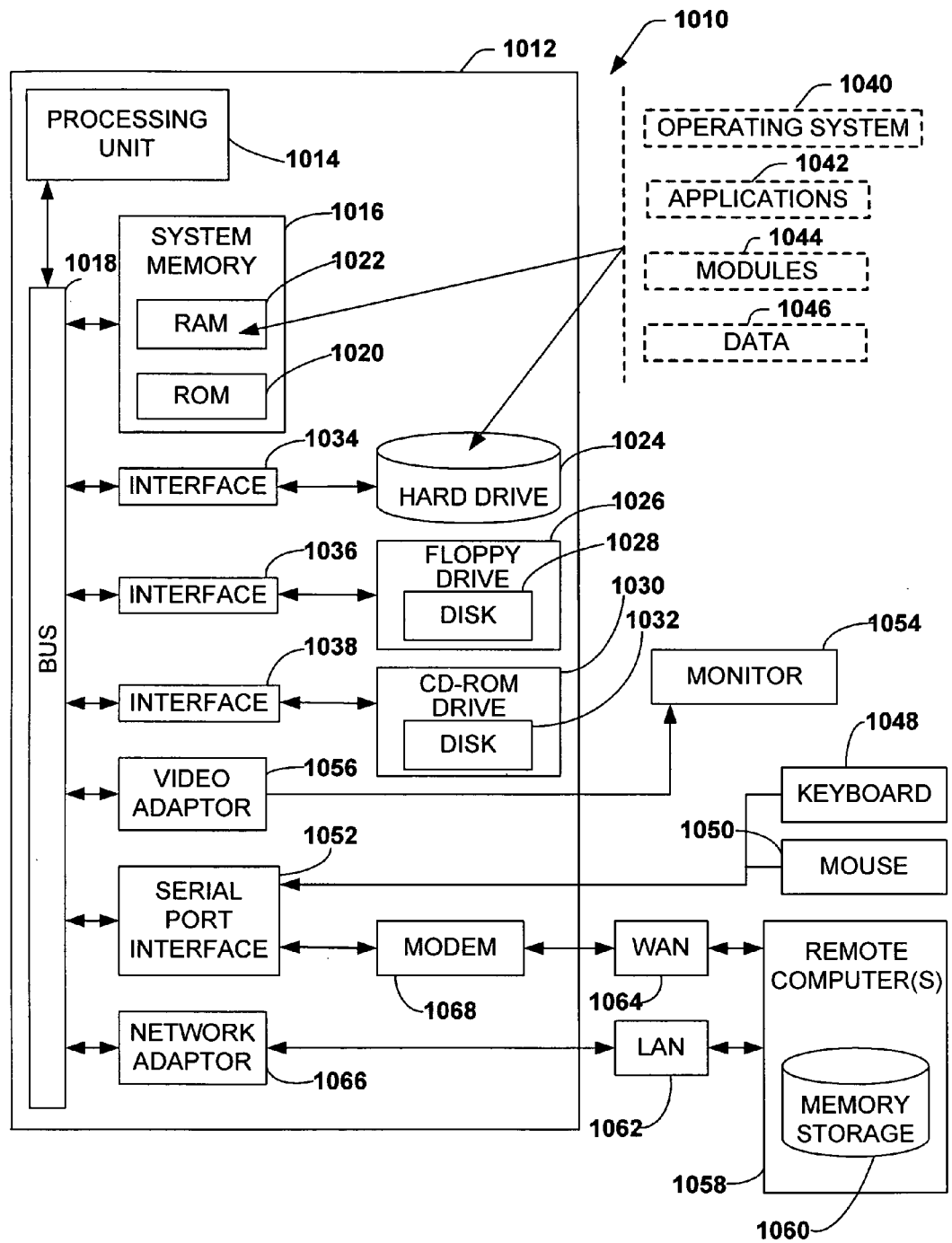
FIG. 10 is an illustration of an exemplary computing system and/or environment in connection with facilitating employment of the subject invention.

In order to provide additional context for various aspects of the present invention, FIG. 10 and the following discussion are intended to provide a brief, general description of a suitable computing environment 1010 in which the various aspects of the present invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 10, an exemplary environment 1010 for implementing various aspects of the invention includes a computer 1012, including a processing unit 1014, a system memory 1016, and a system bus 1018 that couples various system components including the system memory to the processing unit 1014. The processing unit 1014 may be any of various commercially available processors. Dual microprocessors and other multi-processor architectures also can be used as the processing unit 1014.

The system bus 1018 can be any of several types of bus structure including a memory bus or memory controller, a peripheral bus, and a local bus using any of a variety of conventional bus architectures such as PCI, VESA, Microchannel, ISA, and EISA, to name a few. The system memory 1016 includes read only memory (ROM) 1020 and random access memory (RAM) 1022. A basic input/output system (BIOS), containing the basic routines that help to transfer information between elements within the computer 1012, such as during start-up, is stored in ROM 1020.

The computer 1012 further includes a hard disk drive 1024, a magnetic disk drive 1026 to read from or write to, for example, a removable disk 1028, and an optical disk drive 1030 for reading, for example, from a CD-ROM disk 1032 or to read from or write to other optical media. The hard disk drive 1024, magnetic disk drive 1026, and optical disk drive 1030 are connected to the system bus 1018 by a hard disk drive interface 1034, a magnetic disk drive interface 1036, and an optical drive interface 1038, respectively. The drives and their associated computer-readable media provide nonvolatile storage of data, data structures, computer-executable instructions, etc. for the computer 1012, including for the storage of broadcast programming in a suitable digital format. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM 1022, including an operating system 1040, one or more application programs 1042, other program modules 1044, and program data 1046. The operating system 1040 in the illustrated computer is, for example, the "Microsoft® Windows® NT" operating system, although it is to be appreciated that the present invention may be implemented with other operating systems or combinations of operating systems, such as UNIX®, LINUX®, etc.

A user may enter commands and information into the computer 1012 through a keyboard 1048 and a pointing device, such as a mouse 1050. Other input devices (not shown) may include a microphone, an IR remote control, a joystick, a game pad, a satellite dish, a scanner, or the like. These and other input devices are often connected to the processing unit 1014 through a serial port interface 1052 that is coupled to the system bus 1018, but may be connected by other interfaces, such as a parallel port, a game port, a universal serial bus ("USB"), an IR interface, etc. A monitor 1054 or other type of display device is also connected to the system bus 1018 via an interface, such as a video adapter 1056. In addition to the monitor, a computer typically includes other peripheral output devices (not shown), such as speakers, printers etc.

The computer 1012 may operate in a networked environment using logical connections to one or more remote computers, such as a remote computer(s) 1058. The remote computer(s) 1058 may be a workstation, a server computer, a router, a personal computer, microprocessor based entertainment appliance (e.g., a WEBTV® client system), a peer device or other common network node, and typically includes many or all of the elements described relative to the computer 1012, although, for purposes of brevity, only a memory storage device 1060 is illustrated. The logical connections depicted include a local area network (LAN) 1062 and a wide area network (WAN) 1064. Such networking environments are commonplace in offices, enterprise-wide computer networks, intranets and the Internet.

When used in a LAN networking environment, the computer 1012 is connected to the local network 1062 through a network interface or adapter 1066. When used in a WAN networking environment, the computer 1012 typically includes a modem 1068, or is connected to a communications server on the LAN, or has other means for establishing communications over the WAN 1064, such as the Internet. The modem 1068, which may be internal or external, is connected to the system bus 1018 via the serial port interface 1052 to enable communications, for example, via POTS. The modem 1068 may also, in an alternative embodiment, be connected to the network adaptor 1066 to enable communications, for example, via DSL or cable. In a networked environment, program modules depicted relative to the computer 1012, or portions thereof, will be stored in the remote memory storage device 1060. It may be appreciated that the network connections shown are exemplary and other means of establishing a communications link between the computers may be used.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates aligning reticles and wafers, comprising:
   a component that determines a plurality of layers to be formed on a wafer; and
   a component that forms a composite alignment mark on the wafer, the composite alignment mark comprises a first portion associated with one layer of the wafer and a second portion associated with another layer of the wafer, the composite alignment mark is utilized to align a reticle associated with a subsequent layer to be formed on the wafer, with the wafer.

2. The system of claim 1, the first portion and the second portion are patterned from alignment marks of reticles associated with the respective layers.

3. The system of claim 1, the composite alignment mark further comprises gratings.

4. The system of claim 1, the first portion is employed to align the reticle in an x-direction and the second portion is employed to align the reticle in a y-direction.

5. The system of claim 1, further comprising at least one layer between the layers associated with the portions of the composite alignment mark.

6. The system of claim 1, further comprising an alignment component that inspects the composite alignment mark utilized to align the reticle and the wafer.

7. The system of claim 6, the alignment component moves at least one of the wafer and the reticle in response to a signal received from inspection of the composite alignment mark.

8. The system of claim 6, the alignment component compares a position of the composite alignment mark to a position of an alignment mark of a reticle associated with a layer to be created.

9. The system of claim 6, the alignment component is at least one of a scanning electron microscope, a camera, an optical microscope, a laser, a control component, a wafer stage, and a wafer holder.

10. The system of claim 1, a plurality of composite alignment marks are formed.

11. The system of claim 1, further comprising an artificial intelligence component that infers which layers to utilize to form the composite alignment mark.

12. The system of claim 1, composite alignment mark further comprising a third portion associated with a different layer of the wafer.

13. A system that facilitates aligning a wafer and a reticle, comprising:
   means for creating a composite alignment mark associated with disparate layers of the wafer; and
   means for aligning the wafer and the reticle employing the composite alignment mark, wherein the reticle is associated with a subsequent layer to be formed upon the wafer.

14. The system of claim 13, the composite alignment mark comprises more than one portion, each portion associated with a different layer of the wafer.

* * * * *